(12) United States Patent
Likhanskii et al.

(10) Patent No.: US 11,574,800 B2
(45) Date of Patent: Feb. 7, 2023

(54) EXTREME EDGE UNIFORMITY CONTROL

(71) Applicant: Varian Semiconductor Equipment Associates, Inc., Gloucester, MA (US)

(72) Inventors: Alexandre Likhanskii, Middleton, MA (US); Maureen Petterson, Salem, MA (US); John Hautala, Beverly, MA (US); Anthony Renau, West Newbury, MA (US); Christopher A. Rowland, Rockport, MA (US); Costel Biloiu, Rockport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 167 days.

(21) Appl. No.: 16/851,550

(22) Filed: Apr. 17, 2020

(65) Prior Publication Data

US 2020/0243308 A1 Jul. 30, 2020

Related U.S. Application Data

(62) Division of application No. 15/269,026, filed on Sep. 19, 2016, now Pat. No. 10,665,433.

(51) Int. Cl.
*H01J 37/32* (2006.01)

(52) U.S. Cl.
CPC ..... *H01J 37/32651* (2013.01); *H01J 37/3211* (2013.01); *H01J 37/32642* (2013.01);
(Continued)

(58) Field of Classification Search
CPC ............. H01J 37/32651; H01J 37/3211; H01J 37/32642; H01J 37/32715;
(Continued)

(56) References Cited

U.S. PATENT DOCUMENTS

| 5,711,812 A | 1/1998 | Chapek et al. |
| 6,176,981 B1 | 1/2001 | Hong et al. |

(Continued)

FOREIGN PATENT DOCUMENTS

JP 2007258417 A * 10/2007 ........ H01J 37/32642

OTHER PUBLICATIONS

English Machine Translation of Ogasawara (JP-2007258417-A) retrieved from ESPACENET May 3, 2022 (Year: 2022).*

(Continued)

*Primary Examiner* — Ram N Kackar
*Assistant Examiner* — Laureen Chan
(74) *Attorney, Agent, or Firm* — Nields, Lemack & Frame, LLC

(57) ABSTRACT

A workpiece processing apparatus allowing independent control of the voltage applied to the shield ring and the workpiece is disclosed. The workpiece processing apparatus includes a platen. The platen includes a dielectric material on which a workpiece is disposed. A bias electrode is disposed beneath the dielectric material. A shield ring, which is constructed from a metal, ceramic, semiconductor or dielectric material, is arranged around the perimeter of the workpiece. A ring electrode is disposed beneath the shield ring. The ring electrode and the bias electrode may be separately powered. This allows the surface voltage of the shield ring to match that of the workpiece, which causes the plasma sheath to be flat. Additionally, the voltage applied to the shield ring may be made different from that of the workpiece to compensate for mismatches in geometries. This improves uniformity of incident angles along the outer edge of the workpiece.

6 Claims, 9 Drawing Sheets

(52) U.S. Cl.
CPC ............... *H01J 37/32715* (2013.01); *H01J 37/32935* (2013.01); *H01J 2237/332* (2013.01); *H01J 2237/334* (2013.01); *H01J 2237/3365* (2013.01)

(58) Field of Classification Search
CPC .......... H01J 37/32935; H01J 2237/332; H01J 2237/334; H01J 2237/3365; H01J 37/32; H01J 37/32697; H01J 37/32706; C23C 16/4585; H01L 21/68721; H01L 21/68735
See application file for complete search history.

(56) References Cited

U.S. PATENT DOCUMENTS

| | | | |
|---|---|---|---|
| 6,624,084 B2 | 9/2003 | Maeda et al. | |
| 6,885,153 B2 | 4/2005 | Quon | |
| 10,665,433 B2 | 5/2020 | Likhanskii et al. | |
| 2001/0025691 A1 | 10/2001 | Kanno et al. | |
| 2003/0201069 A1* | 10/2003 | Johnson | H01J 37/32642 156/345.43 |
| 2004/0018127 A1* | 1/2004 | Long | H01J 37/32009 422/186.04 |
| 2006/0226786 A1 | 10/2006 | Lin et al. | |
| 2007/0029193 A1* | 2/2007 | Brcka | C23C 14/345 204/298.02 |
| 2008/0135518 A1 | 6/2008 | Chen et al. | |
| 2009/0071938 A1* | 3/2009 | Dhindsa | H01J 37/32091 156/345.48 |
| 2009/0162952 A1 | 6/2009 | Liu et al. | |
| 2010/0006225 A1* | 1/2010 | Yokogawa | H01J 37/32935 156/345.28 |
| 2010/0018648 A1* | 1/2010 | Collins | H01J 37/32174 156/345.24 |
| 2010/0025369 A1* | 2/2010 | Negishi | H01J 37/32935 216/60 |
| 2011/0011534 A1* | 1/2011 | Dhindsa | H01J 37/32623 156/345.43 |
| 2012/0164834 A1 | 6/2012 | Jennings et al. | |
| 2014/0335698 A1 | 11/2014 | Singh et al. | |
| 2015/0170925 A1 | 6/2015 | Chen et al. | |
| 2015/0181684 A1 | 6/2015 | Banna et al. | |
| 2015/0325413 A1* | 11/2015 | Kim | H01J 37/32082 315/111.21 |
| 2016/0351404 A1* | 12/2016 | Aramaki | H01J 37/32715 |
| 2017/0213753 A1* | 7/2017 | Rogers | H01L 21/67017 |
| 2018/0025891 A1* | 1/2018 | Marakhtanov | H01J 37/32091 438/714 |
| 2018/0082824 A1 | 3/2018 | Likhanskii et al. | |

OTHER PUBLICATIONS

International Search Report and Written Opinion dated Nov. 24, 2017 in corresponding PCT application No. PCT/US2017/046914.
Stamate et al, "Improvement of the Dose Uniformity in Plasma Immersed Ion Implantation by Introducing a Vertical Biased Ring," Thin Solid Films, vol. 506-507, pp. 571-574, 2006.

* cited by examiner

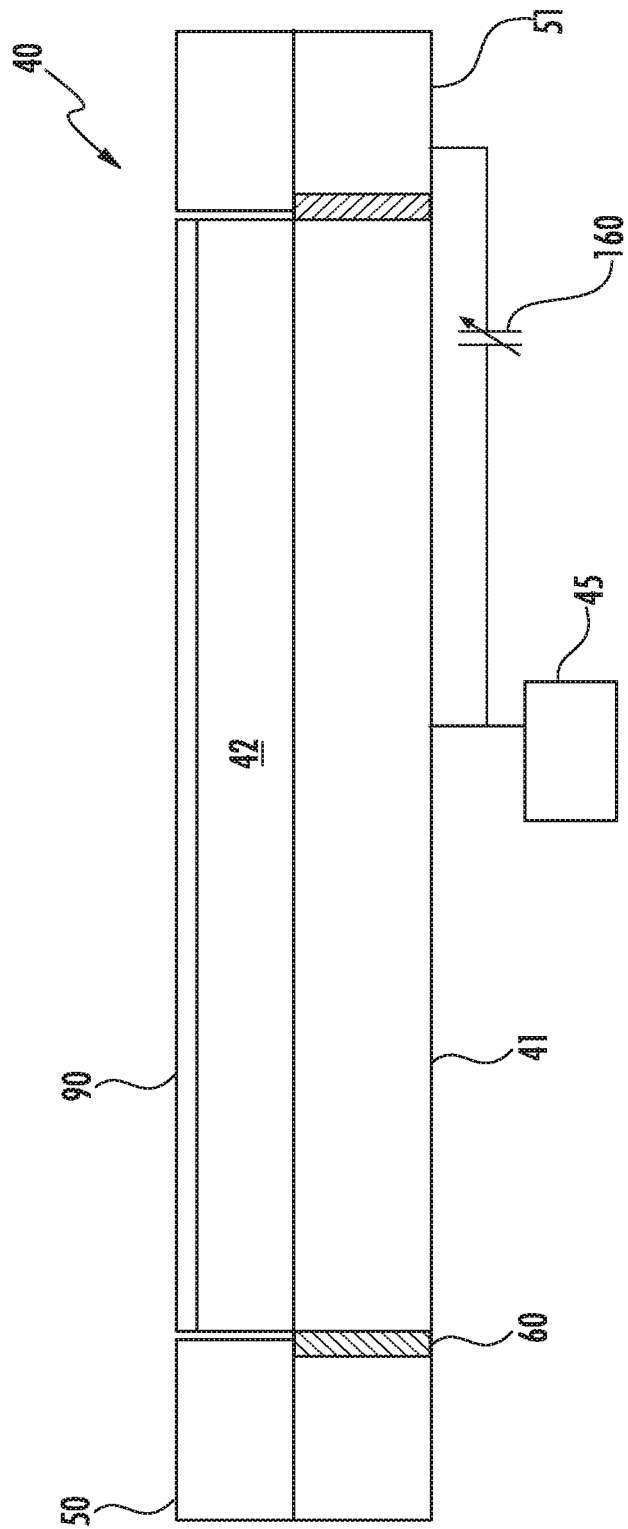

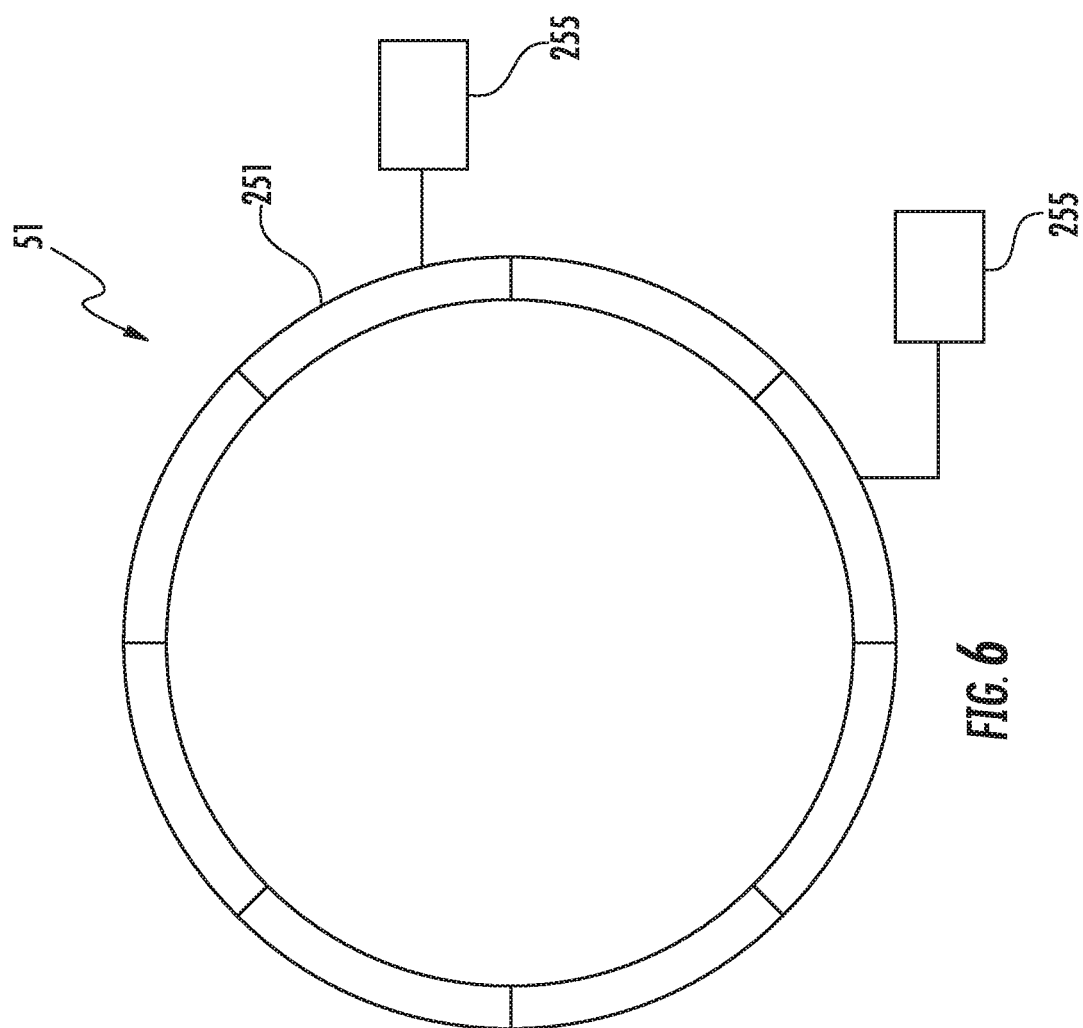

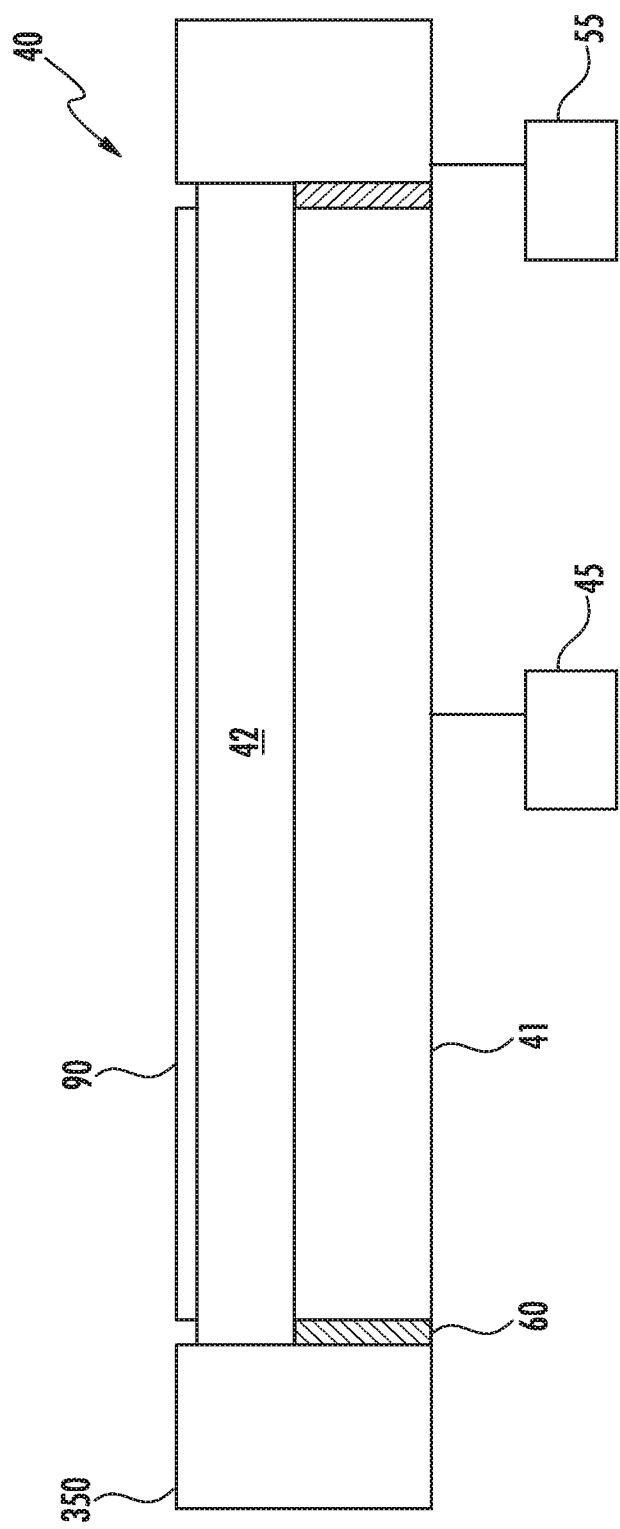

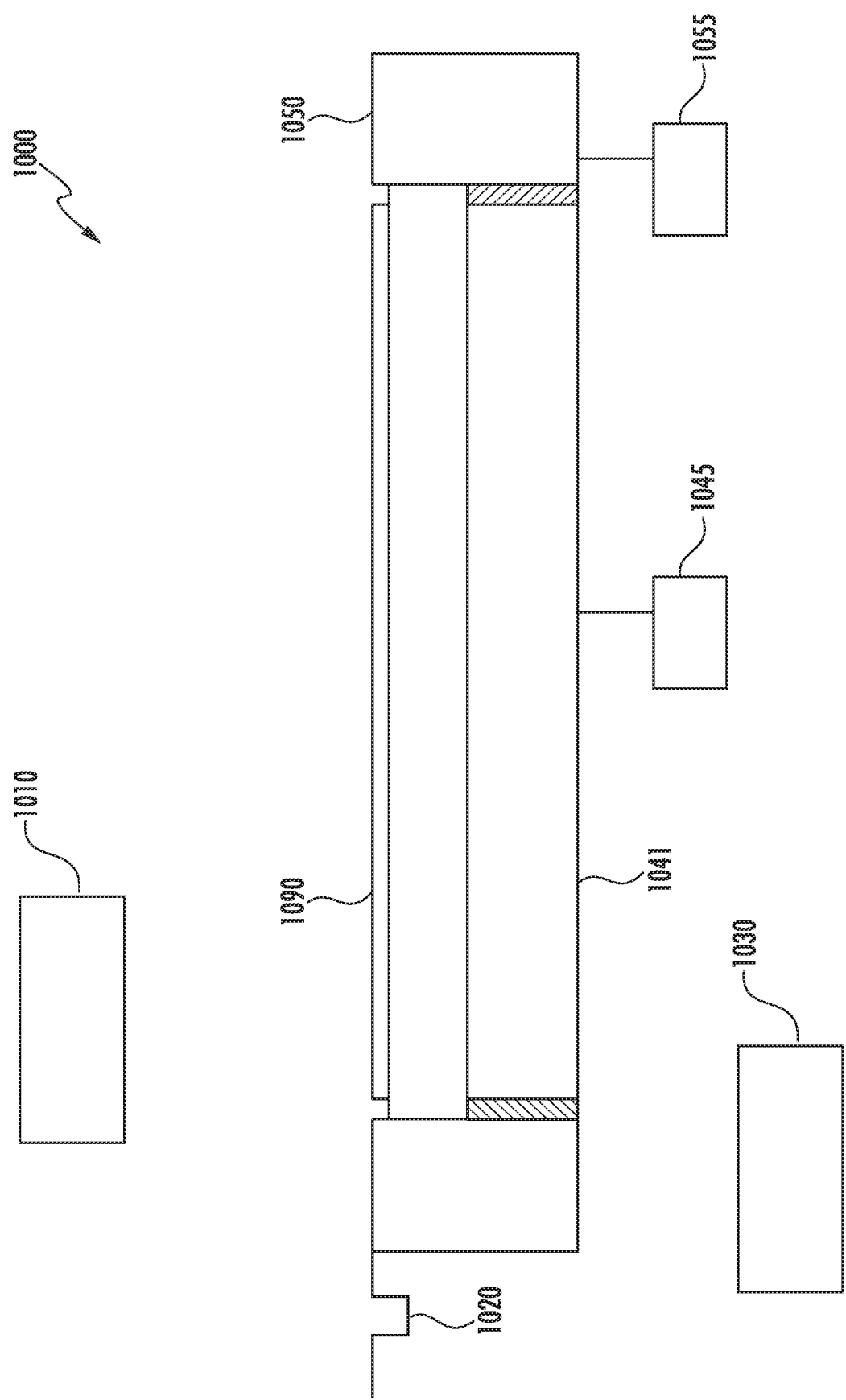

EXTREME EDGE UNIFORMITY CONTROL

This application is a divisional of U.S. patent application Ser. No. 15/269,026 filed Sep. 19, 2016, the disclosure of which is incorporated herein by reference in its entirety.

FIELD

Embodiments of the present disclosure relate to angle and etch rate control for plasma processing chambers, and more particularly, an apparatus for controlling the ion incident angle along an edge of a workpiece.

BACKGROUND

The increasing complexity of devices on a workpiece forces continuous improvement in workpiece processing apparatus. For example, parameters that were adequate for previous geometries may no longer be acceptable. The process uniformity parameters for these shrinking devices impose more stringent constraints on controlling how species arrive to the workpiece. For example, even a few degrees in ion angle skew may lead to unacceptable consequences on device performance.

This problem arises in cases where the plasma sheath above the workpiece is not flat. This can occur as a result of voltage mismatch between the workpiece surface and the shield ring, a geometrical mismatch between these components, or both types of mismatch. Geometry and voltage may also drift during tool operation. For example, the geometry of the shield ring may drift due to etching effects during tool operation and voltage may drift due to charging effects.

As an example, in some workpiece processing apparatus, there is a relationship between the rate and angle at which a portion of the workpiece is etched and the distance from the center of that workpiece. This may be referred to as radial uniformity. Stated differently, the shape of the plasma sheath above the workpiece may change as a function of the distance from the center of the workpiece. This change in shape may be most pronounced at the outer edge of the workpiece, and may affect the angle at which ions strike the workpiece along that outer edge.

Various techniques have been attempted to address this issue of radial uniformity. However, radial non-uniformity still exists and is becoming a more significant issue as geometries continue to shrink.

Thus, it would be beneficial if there was a method and an apparatus which could correct or compensate for this radial non-uniformity along the outer edge of the workpiece. More particularly, it would be beneficial if there were a method and apparatus for adjustable control of the plasma sheath shape so as to adjust ion angles.

SUMMARY

A workpiece processing apparatus allowing independent control of the voltage applied to the shield ring and the workpiece is disclosed. The workpiece processing apparatus includes a platen. The platen includes a dielectric material on which a workpiece is disposed. A bias electrode is disposed beneath the dielectric material. A shield ring, which is constructed from a metal, ceramic, semiconductor or dielectric material, is arranged around the perimeter of the workpiece. In certain embodiments, a ring electrode is disposed beneath the shield ring. The ring electrode and the bias electrode may be separately powered. This allows the voltage generated on the surface of the shield ring to match that of the workpiece, which causes the plasma sheath above the workpiece to be flat. Additionally, the voltage applied to the shield ring may be made different from that of the workpiece to compensate for mismatches in geometries. This improves uniformity of incident angles along the outer edge of the workpiece.

According to one embodiment, a workpiece processing apparatus is disclosed. The workpiece processing apparatus comprises a plasma generator; a plasma chamber; a platen, the platen comprising a dielectric material on which a workpiece is disposed; a bias electrode disposed beneath the dielectric material; a bias power supply to apply a bias voltage to the bias electrode; a shield ring to surround the workpiece; and a ring bias power supply to apply a ring bias voltage to the shield ring; a ring height measurement system; and a controller, in communication with the ring height measurement system, wherein the controller calculates the ring bias voltage to be applied to the shield ring based on input from the ring height measurement system. In certain embodiments, the workpiece processing apparatus further comprises a current measurement device in communication with the controller to measure current directed toward the workpiece, wherein the controller uses input from the current measurement device to calculate the ring bias voltage. In certain embodiments, the controller calculates the ring bias voltage based on a difference in height between the workpiece and the shield ring. In some embodiments, the shield ring is constructed of metal and the ring bias power supply is in electrical communication with the shield ring. In certain embodiments, the shield ring comprises a plurality of arcuate electrodes, which form an annular ring, and wherein the ring bias power supply comprises a plurality of arcuate bias power supplies, each to apply a voltage to a respective one of the arcuate electrodes, and wherein the controller determines the voltage to apply to each of the arcuate electrodes. In certain embodiments, the ring height measurement system comprises a laser.

According to another embodiment, a platen is disclosed. The platen comprises a dielectric material on which a workpiece is disposed; a bias electrode disposed beneath the dielectric material; a bias power supply in communication with the bias electrode; a shield ring, in a shape of an annular ring to surround the workpiece, the shield ring constructed of a non-conductive material; and a ring electrode disposed beneath the shield ring. In some embodiments, the platen comprises a ring power supply in communication with the ring electrode, where the ring electrode and the bias electrode are independently controller. In certain embodiment, the ring power supply supplies a voltage to the ring electrode so that a surface voltage of the shield ring equals a surface voltage of the workpiece. In some embodiments, the ring electrode comprises a plurality of arcuate electrodes, each disposed beneath the shield ring and together forming an annular ring. In certain embodiments, the platen comprises a plurality of arcuate power supplies, each arcuate power supply in communication with a respective arcuate electrode, where the arcuate power supplies are independently controlled.

According to another embodiment, a method of processing a workpiece, wherein the workpiece is disposed on a platen and surrounded by a shield ring, is disclosed. The method comprises manipulating a voltage generated on a surface of the workpiece and a voltage generated on a surface of the shield ring so that a deviation in an incident angle of ions striking the workpiece is less than 0.5° across an entirety of the workpiece. In certain embodiments, the manipulating comprises independently controlling voltages applied to the shield ring and the workpiece. In some embodiments, the voltage applied to the shield ring is manipulated based on a difference in height between the shield ring and the workpiece. In certain embodiments, the difference in height between the shield ring and the workpiece is determined using a laser. In other embodiments, the difference in height between the shield ring and the workpiece is determined based on hours of operation.

BRIEF DESCRIPTION OF THE FIGURES

For a better understanding of the present disclosure, reference is made to the accompanying drawings, which are incorporated herein by reference and in which:

FIG. 5 is an expanded cross-sectional view of the platen according to another embodiment;

FIG. 6 is a top view of the platen according to another embodiment;

FIG. 7 is an expanded cross-sectional view of the platen according to another embodiment;

FIG. 10 shows a system to control the shape of the plasma sheath above the workpiece.

DETAILED DESCRIPTION

Workpieces may be processed using a plasma processing chamber. The workpiece is disposed on a platen, which may be biased, either continuously or in a pulsed fashion, to attract ions from the plasma toward the workpiece. The platen may also include a shield ring that surrounds the outer edge of the workpiece. The shield ring is used to protect the side and underside of the workpiece during processing.

Figure 1:
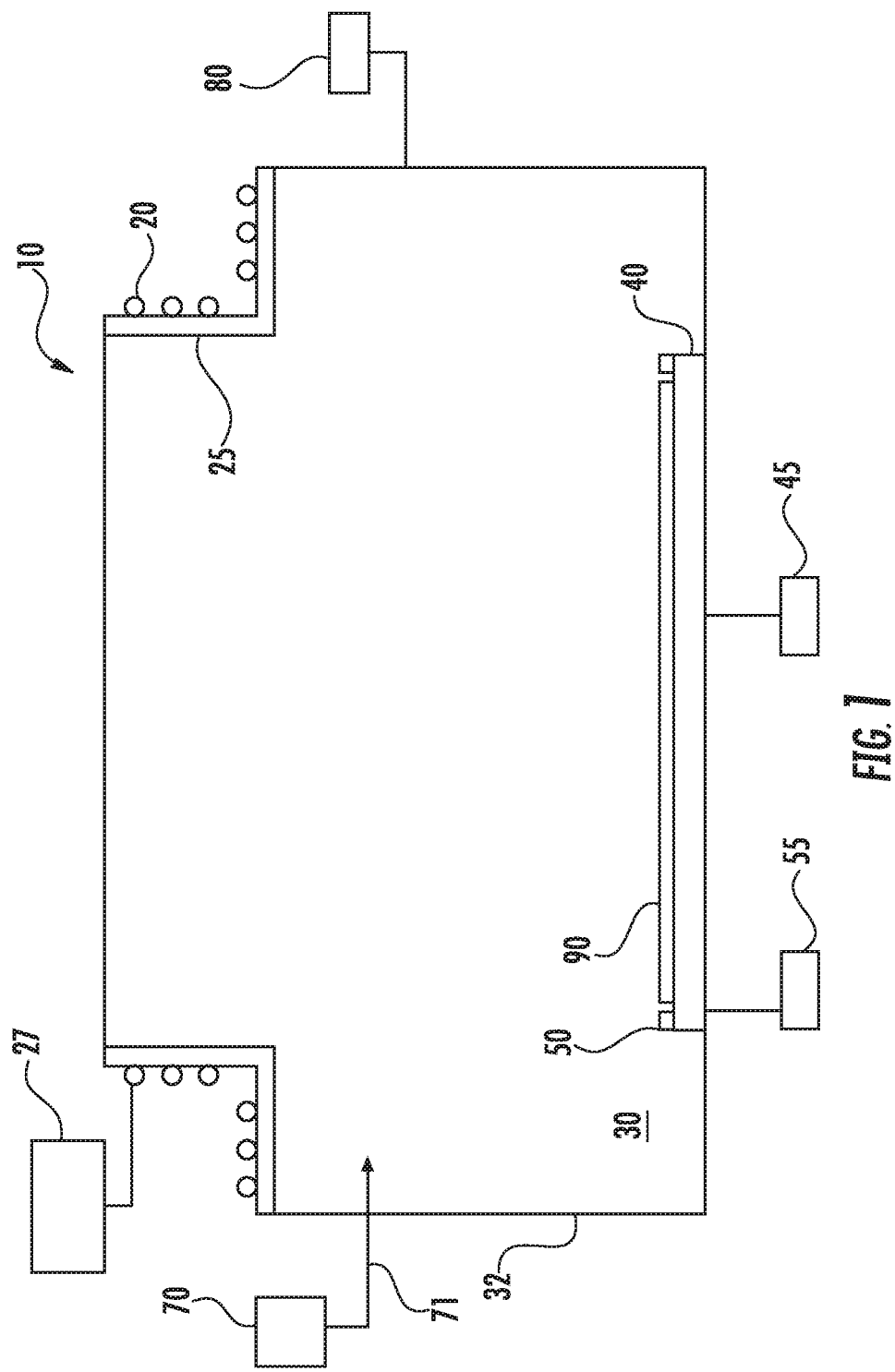
FIG. 1 is a workpiece processing apparatus in accordance with one embodiment.

FIG. 1 shows a first embodiment of workpiece processing apparatus 10 that may be used to control edge uniformity. The workpiece processing apparatus 10 comprises a plasma chamber 30, which is defined by a plurality of chamber walls 32.

An antenna 20 is disposed external to a plasma chamber 30, proximate a dielectric window 25. The dielectric window 25 may also form part of one or more of the walls that define the plasma chamber 30. The antenna 20 is electrically connected to a RF power supply 27, which supplies an alternating voltage to the antenna 20. The voltage may be at a frequency of, for example, 2 MHz or more. While the dielectric window 25 and antenna 20 are shown on part of chamber walls 32 and a top wall of the plasma chamber 30, other embodiments are also possible. For example, the antenna 20 may also be disposed on the top of the plasma chamber 30. The chamber walls 32 of the plasma chamber 30 may be made of a conductive material, such as graphite. These chamber walls 32 may be biased at an extraction voltage, such as by extraction power supply 80. The extraction voltage may be, for example, 1 kV, although other voltages are within the scope of the disclosure. In certain embodiments, an extraction power supply 80 may not be used and the chamber walls 32 may be electrically connected to ground.

The workpiece processing apparatus 10 includes a platen 40 disposed within the plasma chamber 30. The platen 40 may be in electrical communication with a bias power supply 45. A workpiece 90 may be disposed on the top surface of the platen 40. The bias power supply 45 may be used to bias the platen 40 to a bias voltage which is more negative than the voltage of the plasma. This bias voltage attracts positive ions from the plasma toward the workpiece 90. The magnitude of the bias voltage applied by the bias power supply 45 may determine the energy at which these positive ions strike the workpiece 90. In certain embodiments, the magnitude of the bias voltage may be used to determine the rate of processing, such as the etch rate. The magnitude of the bias voltage may also be used to determine the depth of an implantation process. In certain embodiments, the bias voltage supplied by the bias power supply 45 may be a pulsed waveform, such as a square wave. In these embodiments, the workpiece 90 may be processed when the bias voltage is negative, but not processed when the bias voltage is ground or positive. The frequency of the square wave may vary, and may be between 0.1 kHz and 2 MHz. Although a square wave may be used, it is understood that the duty cycle of the pulsed waveform does not have to be 50%. Rather, any duty cycle may be used. In certain embodiments, the bias voltage is applied in the form of a pulsed DC waveform. This pulsed DC waveform may have any frequency, such as between 1 kHz and 1 MHz. Further, the duty cycle is not limited by this disclosure.

Figure 2:
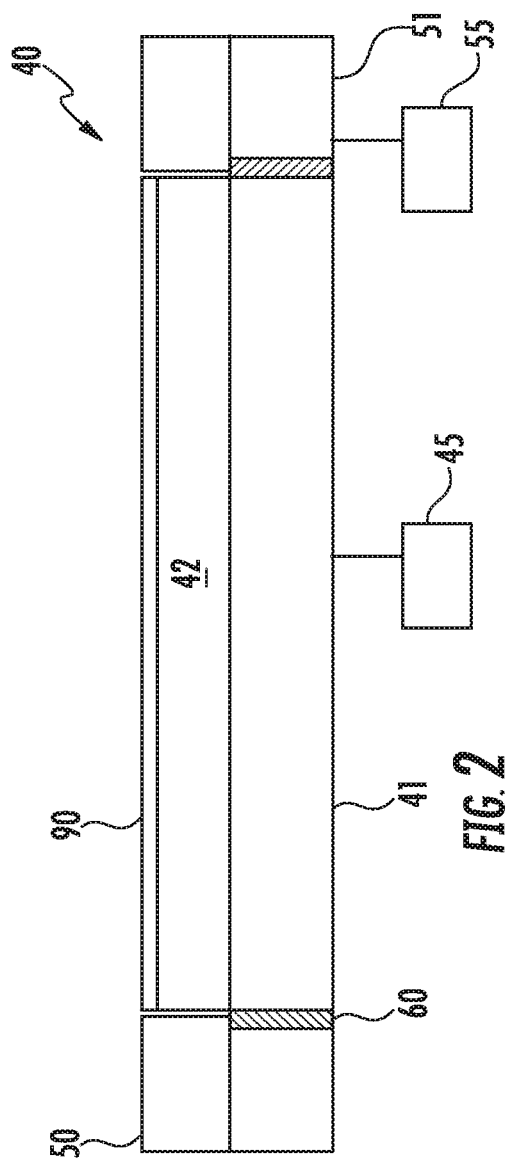
FIG. 2 is an expanded cross-sectional view of the platen according to one embodiment.

As shown in FIG. 2, the platen 40 may include a bias electrode 41, in electrical communication with the bias power supply 45. The bias power supply 45 supplies a bias voltage to the bias electrode 41. A dielectric material 42, such as a ceramic material, is disposed on top of the bias electrode 41 to separate the bias electrode 41 from the workpiece 90 and to protect the bias electrode 41 from ion strike. The dielectric material 42 acts as a capacitor, which allows the bias voltage to be applied to the workpiece 90. A shield ring 50 may be disposed along the outer edge of the workpiece 90. In certain embodiments, the workpiece 90 is round, and the shield ring 50 is constructed as an annular ring. The shield ring 50 may be constructed of a dielectric material, a ceramic material or a semiconductor material, such as for example, silicon carbide (SiC). Other materials that do not contaminate the workpiece may also be used. In some embodiments, the shield ring 50 may be a few millimeters in thickness and have a width of several centimeters. Although the shield ring 50 is much thicker than the workpiece, it may be disposed on the platen 40 such that the top surfaces of the workpiece 90 and the shield ring 50 are aligned. In certain embodiments, the top surface of the shield ring 50 is disposed slightly below the top surface of the workpiece 90 to decrease the possibility of contamination.

A ring electrode 51 may be disposed beneath the shield ring 50. In some embodiments, the ring electrode 51 is completely covered by the shield ring 50 so that the ring electrode 51 is not exposed to the plasma chamber 30. In certain embodiments, the ring electrode 51 may be in electrical communication with the ring bias power supply 55. The ring bias power supply 55 supplies a ring bias voltage to the ring electrode 51. An insulating separator 60 may be used to electrically isolate the ring electrode 51 from the bias electrode 41. In other embodiments, the ring electrode 51 and the bias electrode 41 may be physically separated from one another.

In operation, the antenna 20 is powered using a RF signal from the RF power supply 27 so as to inductively couple energy into the plasma chamber 30. This inductively coupled energy excites the feed gas introduced from a gas storage container 70 via gas inlet 71, thus generating a plasma. While FIG. 1 shows an antenna 20, other plasma generators may also be used with the present disclosure. For example, a capacitively coupled plasma generator may be used.

The plasma within the plasma chamber 30 may be biased at the voltage being applied to the chamber walls 32 by the extraction power supply 80. Alternatively, if an extraction power supply 80 is not employed, the chamber walls 32 may be grounded. The workpiece 90, which may be disposed on a platen 40, is disposed within the plasma chamber 30. The platen 40 may be electrically biased by a bias power supply 45. The difference in potential between the plasma and the workpiece 90 causes charged positive ions in the plasma to be accelerated toward the workpiece 90. In other words, positive ions are attracted toward the workpiece 90 when the voltage applied to the chamber walls 32 is more positive than the bias voltage applied by the bias power supply 45. Thus, to extract positive ions, the chamber walls 32 may be biased at a positive voltage, while the workpiece 90 is biased at a less positive voltage, ground or a negative voltage. In other embodiments, the chamber walls 32 may be grounded, while the workpiece 90 is biased at a negative voltage.

The bias power supply 45 applies a negative voltage to the bias electrode 41, which creates a negative voltage on the workpiece 90. Similarly, the ring bias power supply applies a negative voltage to the ring electrode 51, which, in turn, creates a negative voltage on the shield ring 50. Positive ions are attracted toward the negatively biased workpiece, and are used to perform the desired process, which may be an implantation process, an etching process or a deposition process.

As shown in FIG. 2, the workpiece 90 and the dielectric material 42 may behave as a first capacitor disposed on top of the bias electrode 41. Similarly, the shield ring 50 may behave as a second capacitor disposed on top of the ring electrode 51. The relative sizes, thicknesses and materials may cause these two capacitors to have different values. For example, the combination of dielectric material 42 and workpiece 90 may combine to create a capacitance that is greater than that created by the shield ring 50. Consequently, the resulting voltages that are generated on the surfaces of the shield ring and the workpiece 90 may not be identical. These voltages, which may differ from the voltages supplied by the respective power supplies, are referred to as surface voltages. These unequal surface voltages may result in an uneven plasma sheath at the boundary between the workpiece 90 and the shield ring 50.

Throughout this disclosure, the term "surface voltage" is used to denote the voltage generated on the surface of the component, regardless of the frequency of the bias voltage. In some cases, the surface voltage may equal the voltage applied to the corresponding electrode. In other embodiments, the surface voltage may differ from the voltage applied by the respective power supply due to charging effects.

Figure 4A:
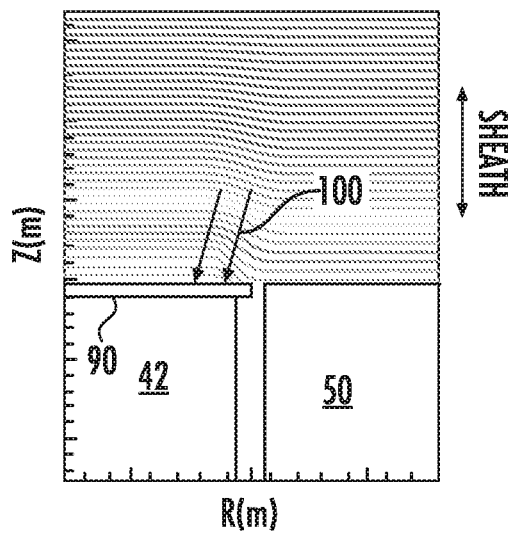
FIGS. 4A-4B shows the plasma density within the workpiece processing apparatus for two different configurations.

FIG. 4A shows an example where the difference in capacitance between the workpiece 90 and the shield ring 50 causes a step in the plasma sheath near the outer edge of the workpiece 90. In these figures, the bias voltage may have an operating frequency of about 2 MHz. The outer edge of the workpiece 90 may be defined as an annular ring having an outer radius equal to the radius of the workpiece and an inner radius that is about 3-5 mm smaller than the outer radius. The horizontal axis represents the distance from the center of the workpiece 90, while the vertical axis represents height. The electrical potential of the plasma sheath is represented by lines of equal electrical potential. In this example, the voltage generated on the shield ring 50 may be somewhat different than the voltage generated on the workpiece 90. Because of this difference, at a given height, the plasma sheath has greater electrical potential in the region above the shield ring 50 than in the region above the workpiece 90. In other embodiments, the plasma sheath may have lesser electrical potential in the region above the shield ring 50.

Ions typically cross the plasma sheath at a trajectory that is perpendicular to these lines of equal electrical potential. Therefore, as shown in FIG. 4A, the ions 100 tend to strike the outer edge of the workpiece 90 at an angle which is not normal to the workpiece 90. In FIG. 4A, this effect occurs at radii greater than about 145 mm, where the workpiece has a radius of 150 mm. In this disclosure, the angle of incidence is referenced to the line normal to the plane of the workpiece 90. In other words, an ion striking the workpiece 90 perpendicular to the plane of the workpiece 90 has an incident angle of 0°. An ion travelling parallel to the plane of the workpiece 90 has an incident angle of 90°. The difference between the surface voltage of the shield ring 50 and the surface voltage of the workpiece 90 may determine the angle of incidence. The greater the difference in the surface voltages, the greater the angle of incidence. Moreover, direction of the ions near the outer edge is determined by polarity of this difference. If the surface voltage of the shield ring 50 is less negative than that of the workpiece, the ions may be directed toward the outer edge of the workpiece, increasing ion flux at the edge of the workpiece compared to the rest of the workpiece 90. In addition, ions near the outer edge will also arrive at an angle with the skew towards the center of the workpiece. If the surface voltage of the shield ring 50 is more negative than that of the workpiece, the ions may be directed toward the shield ring 50.

The non-zero angle of incidence at the outer edge of the workpiece 90 may have two effects. First, as noted above, the angle at which ions 100 strike the outer edge of the workpiece is different than the rest of the workpiece 90. Thus, processes that rely on a uniform angle of incidence, such as, for example, directional etching processes, may be adversely affected. Second, the angle of incidence near the outer edge of the workpiece 90 tends to have a focusing effect, causing more ions to be attracted to the outer edge of the workpiece.

Figure 4B:
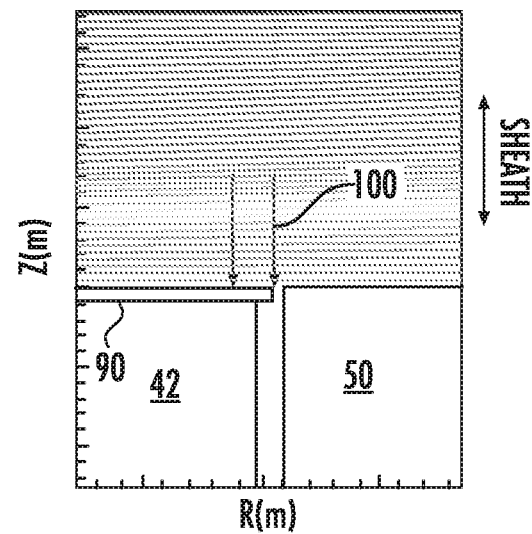

The embodiment shown in FIG. 4A may be created when the bias electrode 41 and the ring electrode 51 are biased at the same voltage, the bias voltage is in the RF frequency range, and the resulting surface voltages are different. As can be seen, ions 100 are directed toward the outer edge of the workpiece 90 at a non-zero angle of incidence. FIG. 4B shows an example where the surface voltage generated at the workpiece 90 and the shield ring 50 are nearly identical. Consequently, the lines of equal electrical potential in the plasma sheath are nearly parallel to the plane of the workpiece 90. Thus, the ions 100 strike the outer edge of the workpiece 90 at an incident angle substantially equal to 0°. This may be achieved by independently controlled the voltages applied by the ring bias power supply 55 and the bias power supply 45.

Thus, by manipulating the voltages applied by the bias power supply 45 and the ring bias power supply 55 so that the plasma sheath is flat near the outer edge of the workpiece 90, the angle of incidence of the ions 100 striking the outer edge of the workpiece 90 may be controlled. Throughout this disclosure, the term "flat" as it refers to the plasma sheath shape denotes a plasma sheath shape in which the incident angle of ions striking the workpiece varies by less than 0.5° across the entirety of the workpiece. In other embodiments, the plasma sheath shape may be manipulated using the apparatus and methods described herein such that the deviation in incident angles is less than 0.2° across the entirety of the workpiece.

Returning to FIG. 2, it is noted that, in certain embodiments, the surfaces that are adjacent to the plasma chamber 30 may be non-conductive materials. Non conductive materials, as that term is used herein, refer to materials such as ceramics, semiconductors or dielectric materials. Specifically, the shield ring 50 is made of a non-conductive material, such as a silicon carbide material. Of course, other materials that do not contaminate the workpiece 90 may also be used. Likewise, the workpiece 90 is also disposed on a dielectric material 42. These non-conductive materials are selected to minimize the amount of contamination created by the sputtering of the shield ring 50. Specifically, in certain embodiments, the use of a metal shield ring may cause metal particles to be sputtered during an etching process and become deposited on the surface of the workpiece 90, thereby affecting the device being created on that workpiece 90.

Because, in this embodiment, the shield ring 50 is not metal, the voltages that are supplied by the ring bias power supply 55 may not be the same as the voltages that are generated on the surface of the shield ring 50. The voltage generated at the surface of the shield ring 50 may be a function of the output of the ring bias power supply 55, the thickness and height of the shield ring 50, the electric potential of the plasma, the dielectric constant of the shield ring 50, and other factors. By being able to separately and independently control the ring bias power supply 55, it become possible to match the voltage generated on the surface of the shield ring 50 to the voltage generated on the surface of the workpiece 90.

FIG. 2 shows a first embodiment of a platen 40 where the shield ring 50 is disposed directly on the ring electrode 51, while the dielectric material 42 is disposed on the bias electrode 41. The dielectric material 42 and the shield ring 50 may be in physical contact or may be separated. However, other embodiments are also possible.

Figure 3:
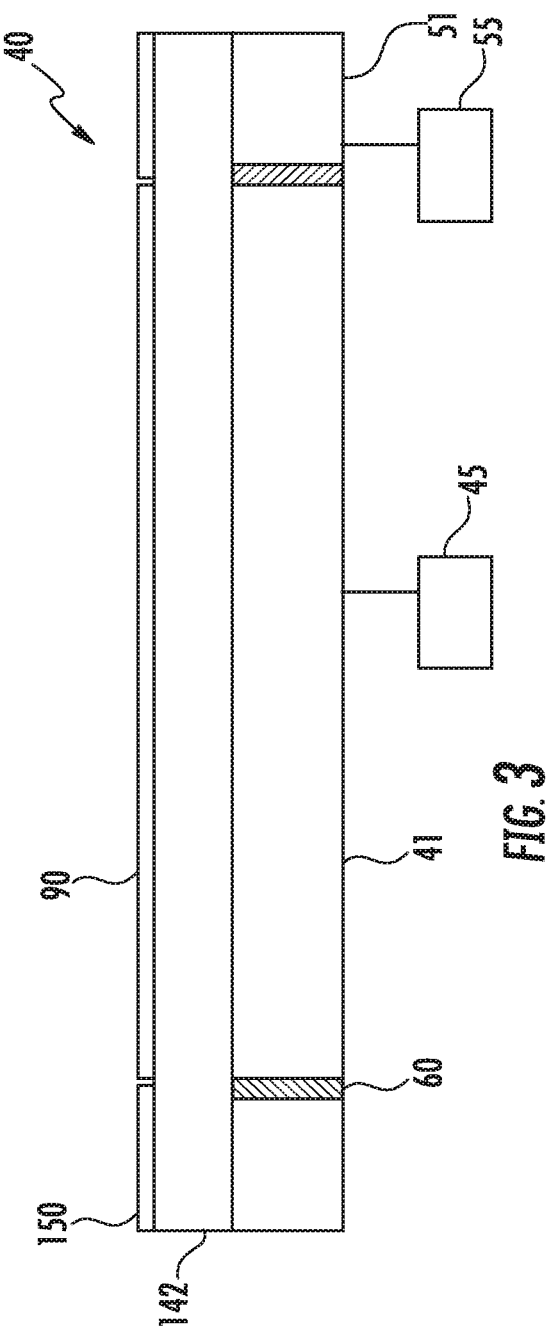
FIG. 3 is an expanded cross-sectional view of the platen according to another embodiment.

FIG. 3 shows another embodiment of a platen 40. In this embodiment, like components have been given identical reference designators. In this embodiment, the dielectric material 142 extends horizontally so as to cover both the ring electrode 51 and the bias electrode 41. The ring electrode 51 and the bias electrode 41 may be separated by an insulating separator 60 or may be physically separated. The workpiece 90 is disposed on the dielectric material 142 directly above the bias electrode 41. A shield ring 150 is disposed on top of the dielectric material 142 above the ring electrode 51. Thus, in this embodiment, the voltage generated on the surface of the shield ring 150 may be a function of the thickness and dielectric constant of the dielectric material 142, the dimensions and dielectric constant of the shield ring 150, the voltage supplied by the ring bias power supply 55, the electrical potential of the plasma and other factors.

As described above, the ring bias power supply 55 and the bias power supply 45 may be separately controlled. In certain embodiments, the magnitude of the voltage supplied by the two power supplies may differ. For example, the voltage supplied by the bias power supply 45 may be −1000V, while the voltage supplied by the ring bias power supply 55 may be different, such as, for example, −900V. In certain embodiments, the phase of the voltage supplied by the ring bias power supply 55 may differ from that supplied by the bias power supply 45. For example, if the power supplies are used to produce pulsed DC waveforms, the phase of the pulsed DC waveform produced by the ring bias power supply 55 may be different from that produced of the bias power supply 45. In other words, there may be an offset in time between the two pulsed waveforms. In one embodiment, the pulse may be applied by the ring bias power supply 55 before the pulse is applied by the bias power supply 45. In other embodiments, the pulse may be applied by the ring bias power supply 55 after the pulse is applied by the bias power supply 45.

The above disclosure described the issues associated with non-equal voltages being generated on the surface of the shield ring 50 and the workpiece 90. As described above, one mechanism that may be used to match the voltage of the shield ring 50 and the workpiece 90 is to independently control the magnitude and phase of the voltage applied to each of these components. A second mechanism that may be used to match these voltages is to modify the frequency of the bias voltage and the ring bias voltage. As described above, many platens use bias voltages that have a frequency in the RF range, typically greater than 1 MHz. By greatly reducing the frequency of the bias voltage and the ring bias voltage, the difference between the applied voltage and the surface voltage of these components may be greatly reduced. Therefore, in certain embodiments, the bias voltage and the ring bias voltage may be a pulsed DC voltage. As described above, this pulsed DC voltage may have a frequency between, for example, 1 kHz and 1 MHz, although other frequencies are possible. Further, the duty cycle of this pulsed DC voltage may be varied and is not limited by this disclosure.

While FIGS. 2-3 show the use of a different power supply to provide the voltage applied to the ring electrode 51, other embodiments are also possible. FIG. 5 shows an embodiment, where the platen 40 is similar in construction to FIG. 2. However, in this embodiment, rather than using a separate power supply to bias the ring electrode 51, a variable impedance 160 is introduced between the bias electrode 41 and the ring electrode 51. This variable impedance 160 may be used to tune the surface voltage generated on the shield ring 50. Thus, while a bias electrode 41 and ring electrode 51 are both employed, only one power supply is used. The variable impedance may be capacitive, resistive, inductive or a combination thereof.

Further, in certain embodiments, the difference between the voltage generated on the surface of the workpiece 90 and the surface of the shield ring 50 may not be constant around the circumference of the workpiece 90. For example, the difference between these voltages may be consistently greater in certain regions than in other regions. To compensate for this phenomenon, the ring electrode 51 may be segmented into a plurality of arcuate electrodes 251, as shown in FIG. 6. The union of all of the arcuate electrodes 251 forms the ring electrode 51. Each of these arcuate electrodes 251 may be in communication with a separate arcuate bias power supply 255, if desired. If desired, the arcuate electrodes 251 may be separated from one another using a separator. In other embodiments, the arcuate electrodes 251 may be physically separated. While eight arcuate electrodes 251 are shown, the number of arcuate electrodes 251 that form the ring electrode 51 is not limited by this disclosure. In this way, the arcuate bias voltage applied to each arcuate electrode 251 may be separately controlled. Further, while only two arcuate bias power supplies 255 are shown, it is understood that each arcuate electrode 251 may be in communication with a respective arcuate bias power supply 255.

While FIG. 6 shows an embodiment employing separate arcuate bias power supplies 255, other embodiments are possible. Of course, the arcuate electrodes 251 may also be used with the variable impedance shown in FIG. 5. In this embodiment, a separate variable impedance may be disposed between the bias electrode 41 and each of the arcuate electrodes 251.

In certain embodiments, a single shield ring may be disposed on top of the plurality of arcuate electrodes 251. In other embodiments, a plurality of arcuate shields is each disposed on a respective arcuate electrode 251 to form the shield ring.

The above disclosure describes the use of a separate ring electrode so that the surface voltage of the shield ring matches the surface voltage on the workpiece. This may be beneficial in various situations. First, as described above, the difference in capacitance may lead the workpiece and the shield ring to have different surface voltages. Second, as the workpiece is processed with ions, the voltage on the surface of the workpiece may change. Independent control of the ring electrode allows for compensation of this charging effect. Third, the shield ring may degrade after prolonged operation. This degradation may affect its surface voltage. In other words, even if the surface voltages of the shield ring and the workpiece were originally equal, this degradation may cause the surface voltage of the shield ring to change over time. Independent control of the ring electrode allows for compensation for this degradation.

Thus, the above disclosure describes issues that may arise due to differences in the surface voltage of the shield ring and the workpiece. These issues may be most problematic when the shield ring is constructed of a non-conductive material.

However, as noted above, other issues may result in a plasma sheath that is not flat over the surface of the workpiece. One such issue is that of geometric mismatch. In other words, the height of the top surface of the workpiece may differ from the height of the top surface of the shield ring. This may be caused by different factors. For example, in one embodiment, the shield ring may have been initially been installed at the same height as the workpiece, but repeated processing has changed the height of the shield ring. If the processing chamber is used for an etching process, the shield ring may be at a lower height due to the etching effects. Conversely, if the processing chamber is used for a deposition process, the shield ring may be at a greater height due to the deposition effects. This change in the height of the shield ring may cause the shape of the plasma sheath to change in the vicinity of the shield ring.

The issue of geometric mismatch between the shield ring and the workpiece may apply to all types of shield rings, including those made of non-conductive and conductive materials.

FIG. 7 shows an embodiment in which the shield ring 350 is conductive. In this embodiment, a separate ring electrode is not needed. Rather, the shield ring 350 combines the functions of the shield ring and the ring electrode described in the previous embodiments. The shield ring 350 may be separated from the bias electrode 41 through the use of an insulating separator 60. In other embodiments, it may be physically separated from the bias electrode 41. Like the previous embodiments, a voltage may be applied to the shield ring 350 by the ring bias power supply 55. In other embodiments, a variable impedance may be disposed between the bias power supply 45 and the shield ring 350, similar to the embodiment shown in FIG. 5.

Figure 8A:
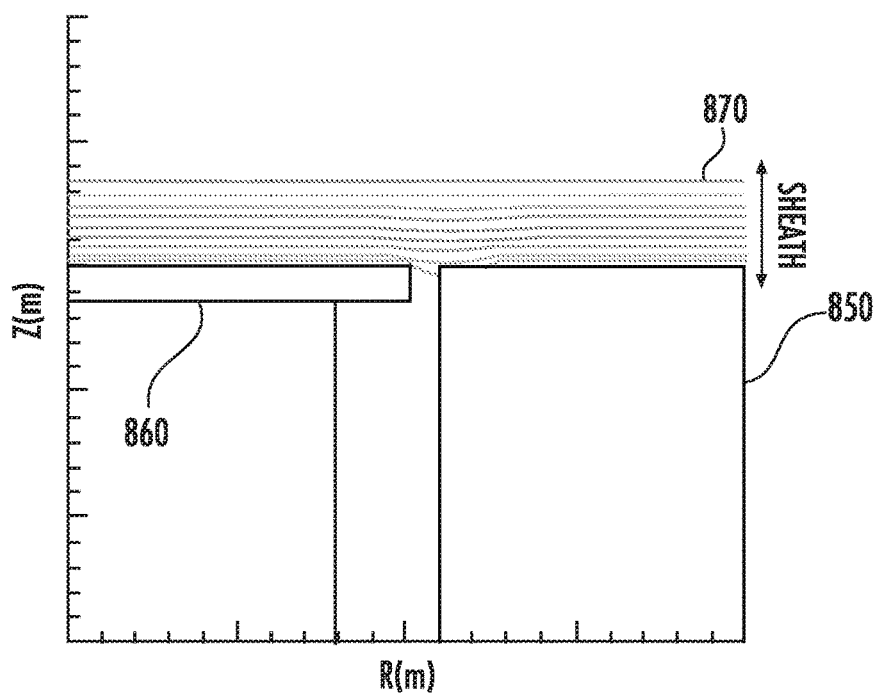
FIGS. 8A-8C show the effect of voltage differences to compensate for geometric mismatches.
Figure 8B:
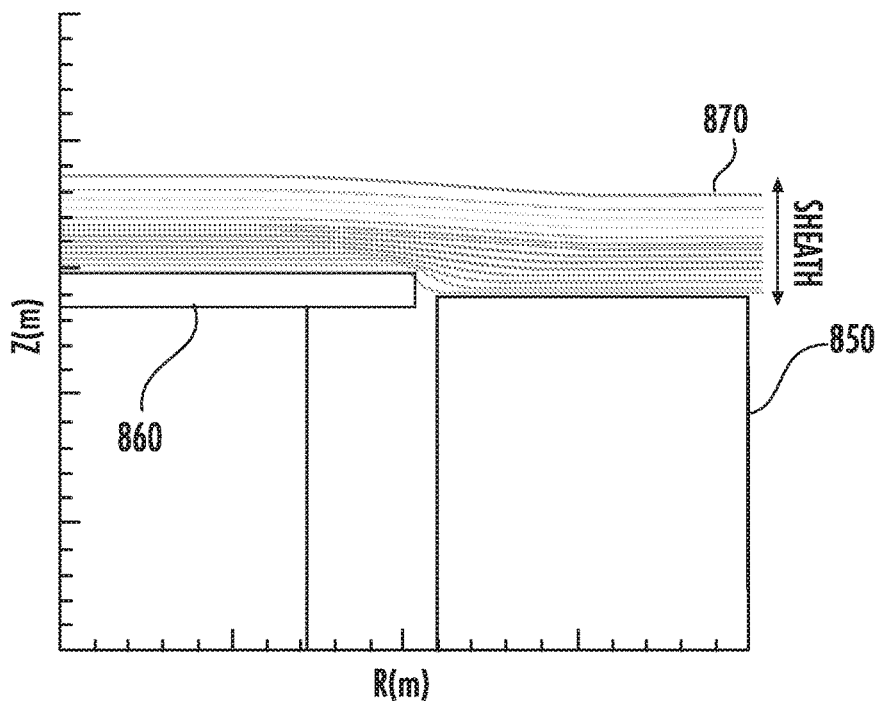
Figure 8C:
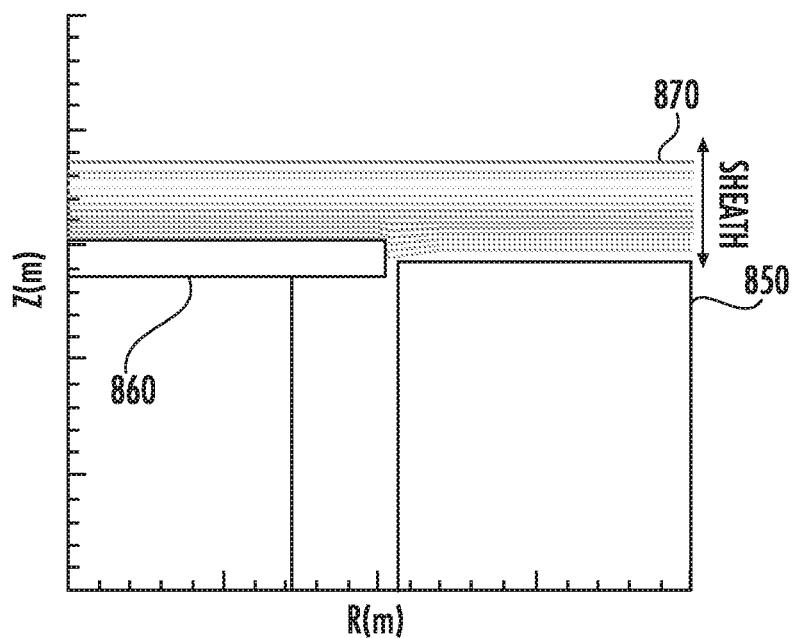

FIGS. 8A-C shows the effects of geometric mismatch. The horizontal axis represents a distance from the center of the workpiece 860. The vertical axis represents height. Like FIGS. 4A-4B, the plasma sheath 870 is shown above the workpiece 860. The electrical potential of the plasma sheath 870 is represented by lines of equal electrical potential.

In FIG. 8A, a new shield ring 850 is installed in a process chamber. As described above, the shield ring 850 may be an annular ring that surrounds the perimeter of the workpiece 860. The top surface of the shield ring 850 is aligned with the top surface of the workpiece 860. Consequently, the plasma sheath 870 above the workpiece 860 is flat.

In this particular illustration, the platen is used in an etching process. After hours of etching processing, the height of the shield ring 850 has been reduced, relative to the top surface of the workpiece 860. Consequently, the plasma sheath 870 in the vicinity of the edge of the workpiece 860 is no longer flat. This causes ions to strike the outer edge of the workpiece 860 at an incident angle that is different than the incident angle for the rest of the workpiece 860. While FIG. 8B shows the shield ring 850 being reduced in height due to etching, deposition processes may cause a similar geometric mismatch, albeit in the opposite direction. In the case of deposition, the height of the shield ring 850 may become greater than that of the top surface of the workpiece 860.

In FIG. 8C, the configuration of FIG. 8B, where the shield ring 850 is etched to a height lower than the workpiece 860, is again shown. However, in this figure, the voltage applied to the shield ring 850 has been changed to compensate for this geometric mismatch. This change in voltage affects the plasma sheath 870, causing it to once again be flat over the surface of the workpiece.

FIGS. 8A-8C illustrate that a difference in height between the shield ring 850 and the workpiece 860 may be problematic. For example, if the shield ring 850 extends upward to a less extent than the workpiece 860, it may affect the shape of the plasma sheath 870. Manipulating the voltage applied to the shield ring 850 may compensate for this geometric mismatch. In other words, in certain embodiments, it may be advantageous to have different voltages on the surfaces of the workpiece and shield ring, if these components have different heights.

Thus, in one embodiment, the present disclosure describes a method for controlling the angle of incidence for ions striking an outer edge of the workpiece. This method includes manipulating the voltages generated on the surface of the workpiece and the surface of the shield ring so that the plasma sheath above the outer edge of the workpiece is flat. In some embodiments, this denotes that the deviation in incident angles across the entirety of the workpiece is less than 0.5°. In other embodiments, this denotes that the deviation in incident angles is less than 0.2°.

In embodiments where voltage mismatch occurs, manipulating these voltages includes applying a voltage to a ring electrode disposed beneath a shield ring such that the voltage generated on the surface of the shield ring matches the voltage generated at the surface of the workpiece. In certain embodiments, there is a known relationship between the hours of operation and the voltage to be applied to the shield ring. In these embodiments, the voltage applied to the ring electrode may vary in response to this known relationship. This relationship may be in the form of an equation or as a table, which maps hours of operation to a ring bias voltage. In other embodiments, means for measuring the voltages generated at the surfaces of the workpiece and shield ring may be provided in the plasma chamber. In these embodiments, the voltage applied to the ring electrode may be controlled based on the actual voltage measurements. Thus, the voltage applied to the ring electrode may be controlled via open loop control or closed loop control.

Figure 9:
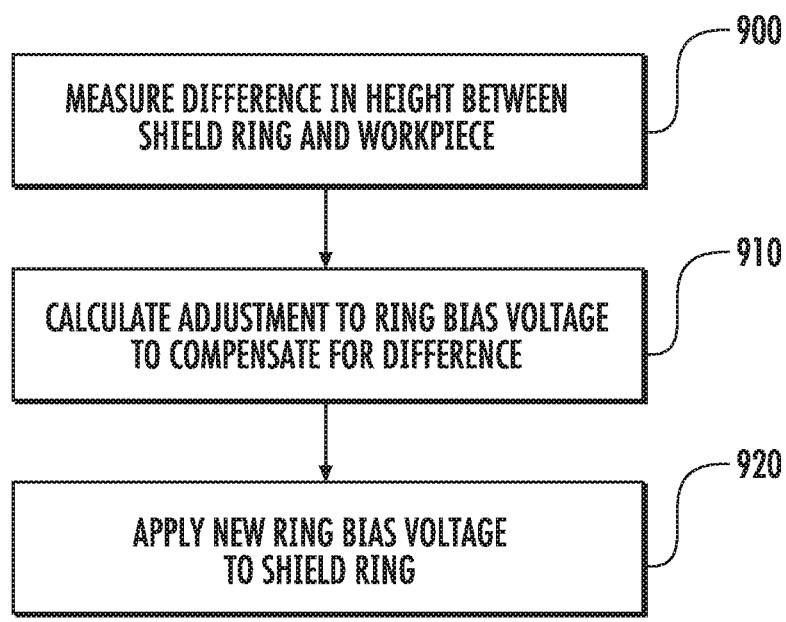
FIG. 9 shows a representative method of controlling the incident angle along the outer edge of a workpiece.

In embodiments where geometric mismatch occurs, the method again includes manipulating the voltages generated on the surface of the workpiece and the surface of the shield ring so that the plasma sheath above the outer edge of the workpiece is flat. In some embodiments, this denotes that the deviation in incident angles across the entirety of the workpiece is less than 0.5°. In other embodiments, this denotes that the deviation in incident angles is less than 0.2°. FIG. 9 shows a flowchart illustrating a method to correct for geometric mismatches. FIG. 10 shows a system 1000 that may execute this method.

First, as shown in Process 900, the difference between the height of the shield ring 1050 and the workpiece 1090 is measured using a ring height measurement system 1010. In one embodiment, the ring height measurement system 1010 may include a laser based measurement system, which measures the height of the shield ring 1050 through the use of a laser. In another embodiment, the ring height measurement system 1010 may include a timer which computes the total amount of time that the shield ring 1050 has been subjected to processing. For example, while workpieces 1090 may be processed for short amounts of time, a shield ring may remain in the processing chamber for hundreds or even thousands of workpieces. In this embodiment, the ring height measurement system 1010 may determine the height of the shield ring 1050 based on this computed processing time. In certain embodiments, a table or equation may be used to determine ring height based on processing time. In yet another embodiment, the ring height measurement system 1010 may be in communication with a current measuring device 1020, such as a Faraday cup. The ring height measurement system 1010 may compute the total amount of current that the shield ring 1050 has been exposed to by integrating the current as measured by the current measuring device 1020 over time. This total amount of current can then be correlated to a change in height using a table or an equation.

The ring height measurement system 1010 may be in communication with a controller 1030. The controller 1030 may include a processing unit, such as a general purpose computer, dedicated or special purpose computer, or an embedded processor. The controller 1030 also comprises a non-transitory storage element which stores the instructions which are executed by the processing unit. These instructions, when executed, enable the controller 1030 to perform the method described herein. The controller 1030 receives the output from the ring height measurement system 1010. In certain embodiments, this output may be a value representing the difference between the height of the shield ring 1050 and the workpiece 1090. In other embodiments, this output may simply be data that the controller 1030 may use to calculate this difference in height.

Based on this height difference, the controller 1030 may determine an adjustment to the ring bias voltage, as shown in Process 910. In certain embodiments, the controller 1030 may simply use a table or an equation to calculate voltage adjustment based on the height difference. In other embodiments, the controller 1030 may use input from the current measuring device 1020 to calculate the adjustment to the ring bias voltage. For example, the magnitude of the adjustment may be a function of many variables, such as height difference, the mass of the ions in the plasma, the current being directed toward the platen, and the bias voltage applied to the bias electrode 1041 by the bias power supply 1045. The controller 1030 then determines the adjustment to the ring bias voltage to compensate for the difference in height.

The controller 1030 then applies this new ring bias voltage to the shield ring 1050, as shown in Process 920. In certain embodiments, the controller 1030 is in communication with the bias power supply 1045 and the ring bias power supply 1055. In these embodiments, the controller 1030 provides an instruction to the appropriate power supply to adjust its output. After completion of this sequence, the plasma sheath should again be flat across the entirety of the workpiece 1090. This allows ions to strike the workpiece 1090 at the substantially same incident angle, regardless of any geometric mismatches.

The system of FIG. 10 may also be used with the configuration shown in FIG. 6. For example, in certain embodiments, the height of the shield ring 1050 may not change in a uniform manner around the circumference of the workpiece 1090. In this embodiment, the ring height measurement system 1010 may determine a height of the shield ring 1050 at a plurality of locations. The controller 1030 may then determine an adjustment in the ring bias voltage to be applied to each of the arcuate power supplies (see FIG. 6).

Further, FIG. 6 is described as an embodiment where the arcuate bias power supplies 255 connect to arcuate electrode 251, which are in turn in communication with the shield ring. However, in another embodiment, the shield ring may be conductive. In this embodiment, the arcuate electrodes 251 are each part of the shield ring. Thus, the configuration of FIG. 7 may also be applied to the embodiment of FIG. 6.

While FIG. 10 shows a shield ring 1050 that is conductive, the above description is equally applicable to the configurations which use non-conductive shield rings, such as those shown in FIGS. 2-3.

Additionally, while FIG. 1 shows an embodiment in which the platen 40 is disposed within the plasma chamber 30, other embodiments are also possible. For example, the plasma chamber 30 may have an extraction aperture, where the platen is located outside the plasma chamber, proximate the extraction aperture. In this embodiment, the bias voltage applied to the workpiece causes positive ions within the plasma chamber to be extracted through the extraction aperture toward the workpiece. The methods and apparatus described herein are equally applicable to this configuration.

The embodiments described above in the present application may have many other advantages. First, the ability to process the outer edge of the workpiece in the same manner as the rest of the workpiece is improved. By separately controlling the voltage applied to a ring electrode, the shape of the plasma sheath above the workpiece may be controlled, allowing much improved processing of the outer edge of the workpiece. In particular, the incident angle of ions along the outer edge more closely matches the incident angle of ions striking other portions of the workpiece. This allows improvements in processes needing a high level of precision regarding the incident angle of the ions, such as etching processes. In addition, by improving the matching of the incident angle of ions along the outer edge, the rate of processing along the outer edge more closely matches the rate of processing on the rest of the workpiece. Furthermore, the use of independent voltages allows for compensation due to geometric mismatches between the workpiece and the shield ring, and allows for compensation due to shield ring degradation. Thus, the present disclosure describes embodiments which allow for the creation of a flat plasma sheath in the presence of voltage and/or geometric mismatches.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A platen, comprising:
   a dielectric material on which a workpiece is disposed; a bias electrode disposed beneath the dielectric material;
   a bias power supply in communication with the bias electrode to supply a bias voltage, wherein the bias voltage comprises a pulsed DC voltage;
   a shield ring, in a shape of an annular ring to surround the workpiece, the shield ring constructed of a non-conductive material;
   a ring electrode disposed beneath the shield ring;
   a ring bias power supply in communication with the ring electrode, to supply a ring bias voltage to the shield ring, wherein the ring bias voltage comprises a pulsed DC voltage and wherein the ring electrode and the bias electrode are independently controlled;
   a current measurement device in communication with the controller to measure current directed toward the workpiece; and
   a controller, wherein the controller is configured to calculate a total amount of current that the shield ring has been exposed to by integrating current as measured by the current measurement device over time, wherein the controller is configured to control a voltage applied to the ring electrode based on the total amount of current so that a surface voltage of the shield ring is nearly equal to a surface voltage of the workpiece such that an incident angle of ions striking the workpiece varies by less than 0.50 across an entirety of the workpiece.

2. The platen of claim 1, wherein the shield ring is constructed of silicon carbide.

3. The platen of claim 1, wherein the shield ring is disposed directly on the ring electrode.

4. The platen of claim 1, wherein the ring electrode comprises a plurality of arcuate electrodes, each disposed beneath the shield ring and together forming an annular ring.

5. The platen of claim 4, comprising a plurality of arcuate bias power supplies, each arcuate bias power supply in communication with a respective arcuate electrode, where the arcuate bias power supplies are independently controlled.

6. The platen of claim 5, where the arcuate bias power supplies each supply a voltage to the respective arcuate electrode so that the surface voltage of the shield ring nearly equals the surface voltage of the workpiece.

* * * * *

UNITED STATES PATENT AND TRADEMARK OFFICE
CERTIFICATE OF CORRECTION

| | | |
|---|---|---|
| PATENT NO. | : 11,574,800 B2 | Page 1 of 1 |
| APPLICATION NO. | : 16/851550 | |
| DATED | : February 7, 2023 | |
| INVENTOR(S) | : Alexandre Likhanskii et al. | |

It is certified that error appears in the above-identified patent and that said Letters Patent is hereby corrected as shown below:

In the Claims

Column 14, Line 8, last line of Claim 1:
Please replace:
"less than 0.50 across an entirety of the workpiece."
With:
-- less than 0.5° across an entirety of the workpiece. --

Signed and Sealed this
Eleventh Day of April, 2023

*Katherine Kelly Vidal*

Katherine Kelly Vidal
*Director of the United States Patent and Trademark Office*